United States Patent [19]

Sanwo et al.

[11] Patent Number: 4,888,499

[45] Date of Patent: Dec. 19, 1989

[54] THREE INPUT EXCLUSIVE OR-NOR GATE CIRCUIT

[75] Inventors: Ikuo J. Sanwo, San Marcos; Gregory H. Milby, San Diego, both of Calif.

[73] Assignee: NCR corporation, Dayton, Ohio

[21] Appl. No.: 259,942

[22] Filed: Oct. 19, 1988

[51] Int. Cl.$^4$ ................. H03K 19/017; H03K 19/096; H03K 19/20

[52] U.S. Cl. .................................... 307/471; 307/451; 307/452

[58] Field of Search ............... 307/471, 472, 451, 585, 307/452; 371/49

[56] References Cited

U.S. PATENT DOCUMENTS

| | | | |
|---|---|---|---|
| 3,693,152 | 9/1972 | Hong | 340/146.1 |
| 3,769,523 | 10/1973 | Suzuki | 307/205 |
| 4,417,161 | 11/1983 | Uya | 307/471 |
| 4,430,737 | 2/1984 | Beranger et al. | 371/49 |
| 4,468,574 | 8/1984 | Engeler et al. | 307/451 |
| 4,477,904 | 11/1984 | Thorsrud | 371/49 |
| 4,558,236 | 12/1985 | Burrows | 307/465 |
| 4,570,084 | 2/1986 | Griffin et al. | 307/471 |
| 4,575,648 | 3/1986 | Lee | 307/471 |
| 4,626,711 | 12/1986 | Li | 307/471 |
| 4,710,650 | 12/1987 | Shoji | 307/452 |
| 4,713,790 | 12/1987 | Kloker et al. | 307/471 |
| 4,749,887 | 6/1988 | Sanwo et al. | 307/471 |

OTHER PUBLICATIONS

Hoover, "Cascaded EXOR Circuit", IBM Technical Disclosure Bul, Vol. 25, No. 6, Nov., 1982, pp. 2789-2790.
Griffin et al., "3-Way EXOR Circuit", IBM Tech. Disclosure Bulletin, Vol. 25, No. 11B, Apr., 1983, pp. 6062-6063.

Primary Examiner—Andrew J. James
Assistant Examiner—Timothy P. Callahan
Attorney, Agent, or Firm—Wilbert Hawk, Jr.; Stephen F. Jewett; Douglas S. Foote

[57] ABSTRACT

A three input Exclusive OR-NOR gate circuit. The circuit comprises inverters for receiving three input signals and for providing three inverted input signals, a power potential terminal, a reference potential terminal, and an Exclusive NOR output node and an Exclusive OR output node. The circuit also includes transistors of a first conductivity type responsive to the signals on the output nodes for connecting the power potential terminal solely to one of the output nodes, and transistors of a second conductivity type responsive to the input and inverted input signals for connecting the reference potential terminal solely to the other of the output nodes.

15 Claims, 2 Drawing Sheets

THREE INPUT EXCLUSIVE OR-NOR GATE CIRCUIT

The present invention relates to an Exclusive OR-NOR gate circuit and, more particularly, to a three input OR-NOR gate which may be adapted for use in a parity checking circuit.

BACKGROUND OF THE INVENTION

Parity checking circuits verify the correct operation of a data processing system by providing a summation check in which the bits in a group are added and the sum checked against a single previously computed parity digit. In other words, the checking circuit tests whether the number of "one" bits in the group is even or odd. In a typical operation, a data byte having eight bits has an additional ninth bit appended to it for the parity check. If odd parity has been preselected, the sum of the nine bits must be odd. Thus, if the eight bits sum to zero, two, four, six or eight, the parity bit will be a one so that the sum of the nine bits is odd. If the eight bits sum to one, three, five or seven, the parity bit will be a zero. In this manner, errors in the storage or transmission of data may be detected.

Typical prior art parity circuits use eight, two-input Exclusive-OR gates for processing nine bits (one byte and an associate parity bit). An improved parity checking circuit is disclosed in U.S. Pat. No. 4,749,887, entitled, "3-Input Exclusive-OR Gate Circuit", by I. Sanwo, et al. The '887 patent discloses a three input Exclusive OR gate for use in a parity checking circuit. The '887 patent is a significant improvement over prior art circuits by its reduced gate count and improved performance. One feature of the '887 patent is a number of NMOS/PMOS transistor "pairs". Such pairs require jumper wire connections which may have node capacitance and require additional layout space in an integrated circuit implementation.

OBJECTS OF THE INVENTION

It is therefore an object of the present invention to provide a new and improved three input Exclusive OR-NOR gate circuit.

It is another object of the present invention to provide a three input Exclusive OR-NOR gate for use in a parity checking circuit.

It is yet another object of the present invention to provide a three input Exclusive OR-NOR gate circuit with enhanced performance through reduced gate count and node capacitance.

SUMMARY OF THE INVENTION

The present invention is a three input Exclusive OR-NOR gate circuit comprising inverting means for receiving three input signals and for providing three inverted input signals, a power potential terminal, a reference potential terminal, and an Exclusive NOR output node and an Exclusive OR output node. The invention also includes switching means of a first conductivity type responsive to the signals on the output nodes for connecting the power potential terminal solely to one of the output nodes, and switching means of a second conductivity type responsive to the input and inverted input signals for connecting the reference potential terminal solely to the other of the output nodes.

DETAIL DESCRIPTION OF THE INVENTION

Figure 1:
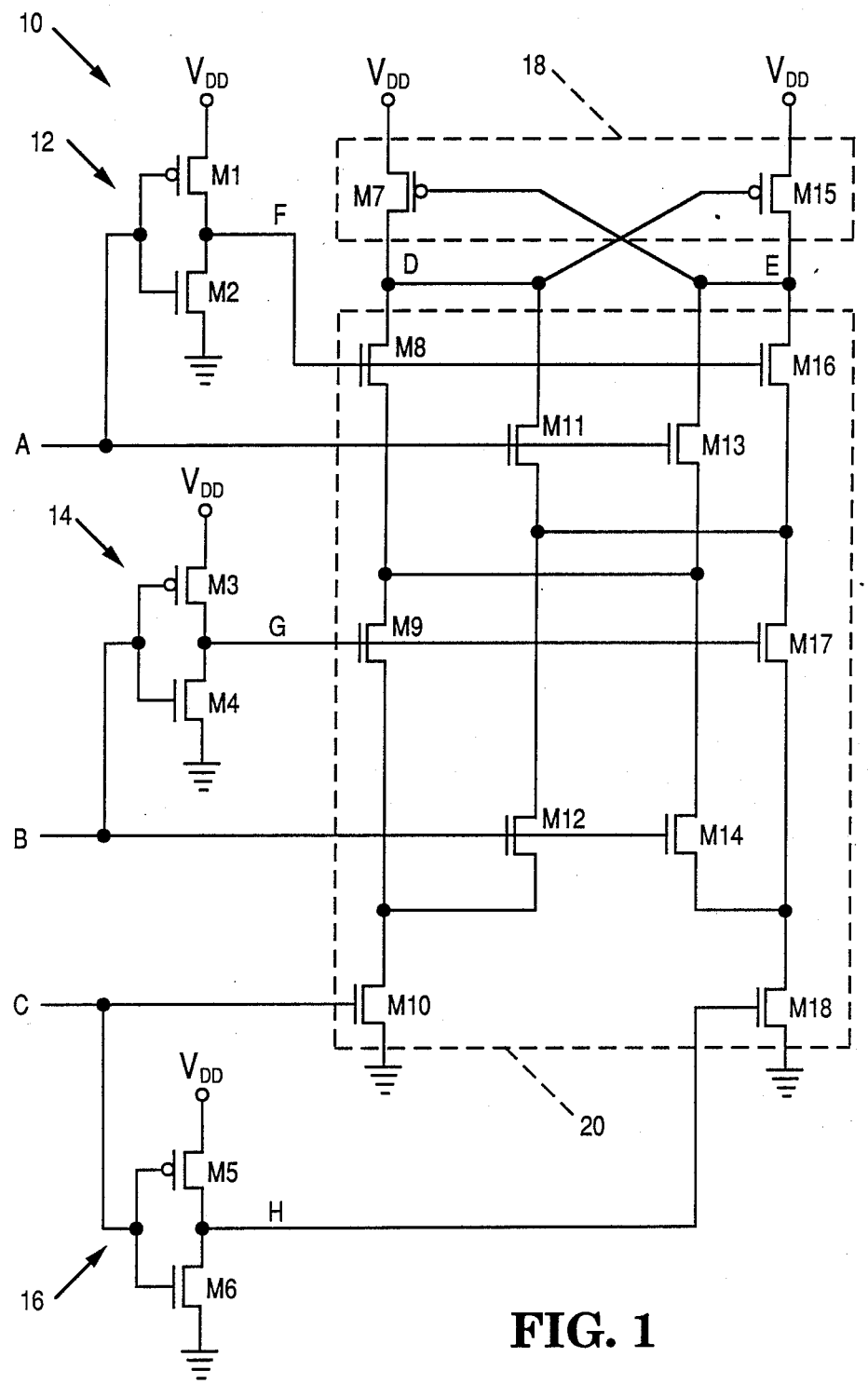
FIG. 1 is a schematic diagram of a preferred embodiment of the present invention.

FIG. 1 shows an Exclusive OR-NOR gate circuit 10 having three inputs labeled A, B and C for receiving three input signals, and having an Exclusive NOR output node labeled D and an Exclusive OR output node labeled E. Means for inverting the three input signals are provided in the form of CMOS inverters 12, 14 and 16. Inverter 12 consists of PMOS transistor M1 series connected with NMOS transistor M2 between a power potential terminal $V_{DD}$ and a reference potential terminal which in a preferred embodiment is ground. Similarly, inverter 14 consists of PMOS transistor M3 series connected with NMOS transistor M4 between power potential terminal $V_{DD}$ and ground, and inverter 16 consists of PMOS transistor M5 series connected with NMOS transistor M6 between power potential terminal $V_{DD}$ and ground. Each of inverters 12, 14 and 16 has an input for receiving one of three logical input signals on inputs A, B and C, respectively. Each inverter 12, 14 and 16 has an output labeled F, G and H, respectively, for providing an output signal which is an inverted input signal.

Circuit 10 further includes power potential terminal $V_{DD}$ and switching means 18. Switching means 18 is responsive to the signals on output nodes D and E thereby connecting power potential terminal $V_{DD}$ solely to Exclusive NOR output node D or Exclusive OR output node E. Switching means 18 includes PMOS transistor M7 connected between power potential terminal $V_{DD}$ and Exclusive NOR output node D, and PMOS transistor M15 connected between power potential terminal $V_{DD}$ and Exclusive OR output node E. Each PMOS transistor M7 and M15 has a source, drain and gate or control electrode with the gate of PMOS transistor M7 connected to Exclusive OR output node E and the gate of PMOS transistor M15 connected to Exclusive NOR output node D. In one embodiment, the source of PMOS transistor M7 is connected to power potential terminal $V_{DD}$ and the drain of PMOS transistor M7 is connected to Exclusive NOR output node D, and the source of PMOS transistor M15 is connected to power potential terminal $V_{DD}$ and the drain of PMOS transistor M15 is connected to Exclusive OR output node E.

Circuit 10 also includes switching means 20 and a reference potential terminal which in a preferred embodiment is ground. Switching means 20 connects the reference potential terminal solely to whichever output node D or E is not connected to power potential terminal $V_{DD}$. Switching means 20 includes NMOS transistors M8, M9, M10, M11, M12, M13, M14, M16, M17 and M18 which are responsive to the signals on inputs A, B and C and inverter outputs F, G and H. NMOS transistors M8, M9 and M10 are series connected between Exclusive NOR output node D and the reference potential terminal. NMOS transistors M16, M17 and M18 are series connected between Exclusive OR output node E and the reference potential terminal. NMOS transistors M11 and M12 are series connected between Exclusive NOR output node D and NMOS transistor M10. NMOS transistors M13 and M14 are series connected between Exclusive OR output node E and NMOS transistor M18. Each NMOS transistor M8, M9, M10, M11, M12, M13, M14, M16, M17 and M18 has a source, drain and gate or control electrode. The gates of NMOS transistors M8 and M16 are connected to first inverter output F. The gates of NMOS transistors M11 and M13 are connected to first inverter input A. The gates of NMOS transistors M9 and M17 are connected to second inverter output G. The gates of NMOS transistors M12 and M14 are connected to second inverter input B. The gate of NMOS transistor M10 is connected to third inverter input C and the gate of NMOS transistor M18 is connected to third inverter output H.

In one embodiment, the drain of NMOS transistor M8 is connected to Exclusive NOR output node D, the source of NMOS transistor M8 is connected to the drain of NMOS transistor M9, the source of NMOS transistor M9 is connected to the drain of NMOS transistor M10, and the source of NMOS transistor M10 is connected to the reference potential terminal. The drain of NMOS transistor M16 is connected to Exclusive OR output node E, the source of NMOS transistor M16 is connected to the drain of NMOS transistor M17, the source of NMOS transistor M17 is connected to the drain of NMOS transistor M18, and the source of NMOS transistor M18 is connected to the reference potential terminal. The drain of NMOS transistor M11 is connected to Exclusive NOR output node D, the source of NMOS transistor M11 is connected to the drain of NMOS transistor M12, and the source of NMOS transistor M12 is connected to the drain of NMOS transistor M10. The drain of NMOS transistor M13 is connected to Exclusive OR output node E, the source of NMOS transistor M13 is connected to the drain of NMOS transistor M14, and the source of NMOS transistor M14 is connected to the drain of NMOS transistor M18. However, the source and drain connections may be reversed without departing from the present invention.

It will be noted that the two transistors of switching means 18 are of P-type conductivity, whereas the ten transistors of switching means 20 are of N-type conductivity. This is an advantage because CMOS circuits normally consist of PMOS/NMOS transistor pairs and CMOS design requires the separation of the PMOS and NMOS transistor areas. A circuit having a majority of NMOS (unpaired) transistors will simplify the layout since the NMOS transistors can be placed in a common area and no interconnections to the PMOS transistors are required. Furthermore, NMOS transistors are smaller than their counterpart PMOS transistors since the mobility of electrons in NMOS transistors is at least twice the mobility of holes in PMOS transistors. Therefore, a layout which contains a majority of NMOS transistors will inherently use less silicon area since smaller NMOS devices can be used to obtain the desired performance.

In operation, signals appearing on inputs A, B and C will generate Exclusive NOR and Exclusive OR outputs on nodes D and E, respectively. In the following truth table, labeled TABLE 1, there is disclosed the relationship between the signals on the inputs labeled A, B and C to the logic level of the signals on the Exclusive NOR output node D and the Exclusive OR output node E. In the nomenclature used in TABLE 1, L stands for a low level signal and H stands for a high level signal.

TABLE 1

| Input | | | Output | |
| --- | --- | --- | --- | --- |
| A | B | C | D | E |
| L | L | L | H | L |
| L | L | H | L | H |
| L | H | L | L | H |
| L | H | H | H | L |
| H | L | L | L | H |
| H | L | H | H | L |
| H | H | L | H | L |
| H | H | H | L | H |

In the following state table, labeled TABLE 2, there is disclosed the "ON" and "OFF" states for each of the MOS transistors labeled M1–M18 for the full range of logic possibilities for the signals applied to the inputs A, B and C.

TABLE 2

| A | B | C | M1 | M2 | M3 | M4 | M5 | M6 | M7 | M8 | M9 |
| --- | --- | --- | --- | --- | --- | --- | --- | --- | --- | --- | --- |
| L | L | L | ON | OFF | ON | OFF | ON | OFF | ON | ON | ON |
| L | L | H | ON | OFF | ON | OFF | OFF | ON | OFF | ON | ON |
| L | H | L | ON | OFF | OFF | ON | ON | OFF | OFF | ON | OFF |
| L | H | H | ON | OFF | OFF | ON | OFF | ON | ON | ON | OFF |
| H | L | L | OFF | ON | ON | OFF | ON | OFF | OFF | OFF | ON |
| H | L | H | OFF | ON | ON | OFF | OFF | ON | ON | OFF | ON |
| H | H | L | OFF | ON | OFF | ON | ON | OFF | ON | OFF | OFF |
| H | H | H | OFF | ON | OFF | ON | OFF | ON | OFF | OFF | OFF |

| A | B | C | M10 | M11 | M12 | M13 | M14 | M15 | M16 | M17 | M18 |
| --- | --- | --- | --- | --- | --- | --- | --- | --- | --- | --- | --- |
| L | L | L | OFF | OFF | OFF | OFF | OFF | OFF | ON | ON | ON |
| L | L | H | ON | OFF | OFF | OFF | OFF | ON | ON | ON | OFF |
| L | H | L | OFF | OFF | ON | OFF | ON | ON | ON | OFF | ON |
| L | H | H | ON | OFF | ON | OFF | OFF | OFF | ON | OFF | OFF |
| H | L | L | OFF | ON | OFF | ON | OFF | ON | OFF | ON | ON |
| H | L | H | ON | ON | OFF | ON | OFF | OFF | OFF | ON | OFF |
| H | H | L | OFF | ON | ON | ON | ON | OFF | OFF | OFF | ON |
| H | H | H | ON | ON | ON | ON | ON | ON | OFF | OFF | OFF |

Figure 2:
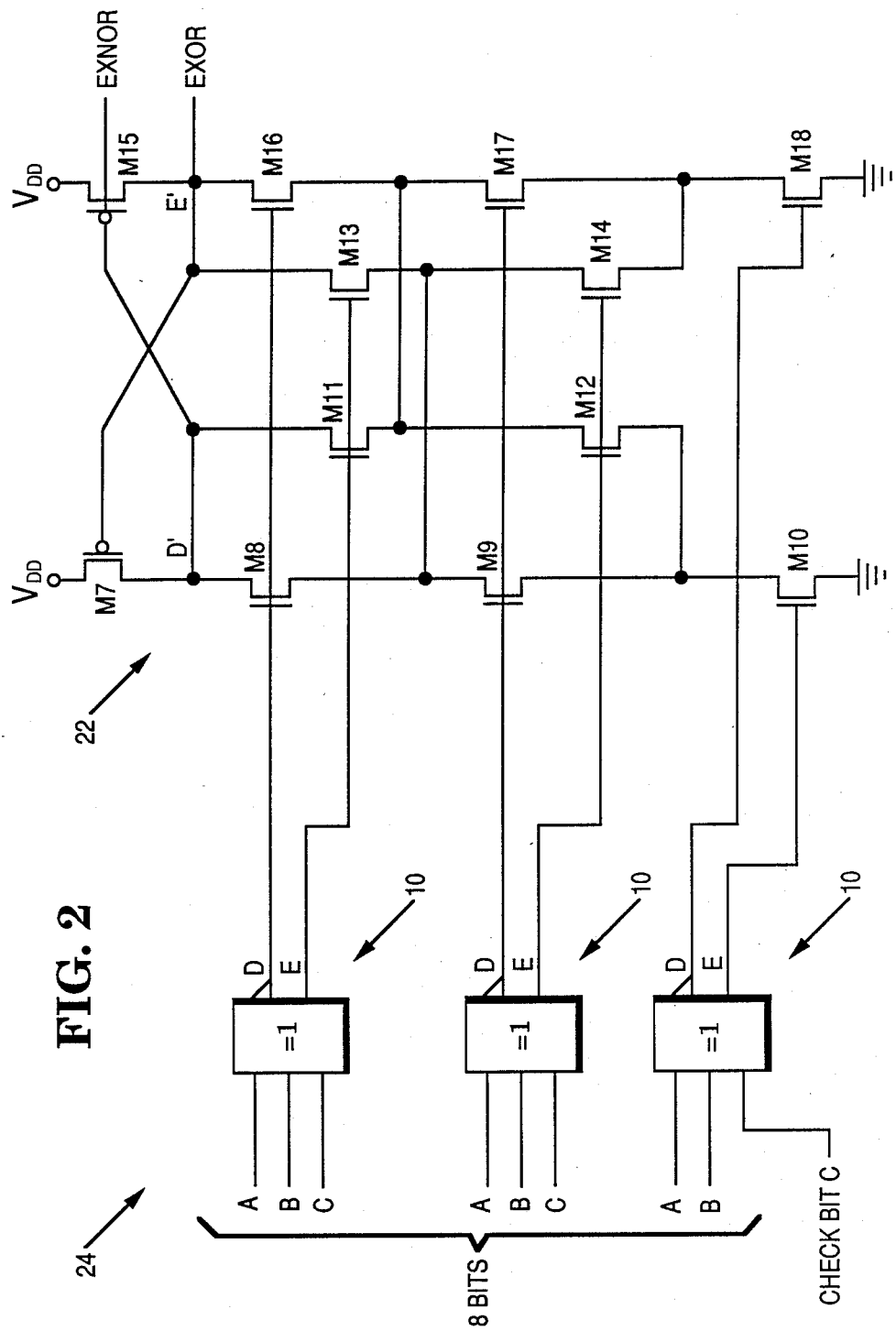
FIG. 2 is a schematic diagram illustrating the configuration of a parity checking circuit incorporating the circuit shown in FIG. 1.

FIG. 2 shows a parity checking circuit 24 comprising three of the Exclusive OR-NOR gate circuits 10 of FIG. 1 connected to an Exclusive OR-NOR gate circuit 22 through Exclusive NOR output nodes D and Exclusive OR output nodes E. Circuit 24 receives nine bits as inputs, eight bits of data and one parity check bit, with each circuit 10 receiving three of the bits. The Exclusive NOR output D and Exclusive OR output E from each circuit 10 provide the inputs for circuit 22. It should be clear that circuit 22 is the same as circuit 10 without inverters 12, 14 and 16. The signals on Exclusive OR output nodes E provide the equivalent input signals to circuit 24 as inputs A, B and C provide to circuit 10, and the signals on Exclusive NOR output nodes D provide the equivalent signals to circuit 24 as inverter outputs F, G and H provide to circuit 10. Parity checking circuit 24 provides an Exclusive NOR output signal on node D' and an Exclusive OR output signal on node E'. The signal on node D' will be of a first logic level when the eight bits and the check bit are in a correct relationship and will be of a second logic level when any of the eight bits are in error. The signal on node E' will be the inverse of that on node D' and can be used in a similar manner.

Having both Exclusive NOR and Exclusive OR outputs may provide an advantage over circuits with only one of these logical outputs. Many times in CMOS logic design both the Exclusive NOR and Exclusive OR functions are required to implement the desired function. One such case is the creation of higher order (higher input count) Exclusive OR (parity checking) circuits. Normally, if an Exclusive OR is being used to create the higher input function, an inverter (additional gate) is inserted to form the required complement. The subject invention eliminates the extra gate requirement by providing both the Exclusive OR and its complement and allows for the subject three input circuit to be easily cascaded to form the higher order functions. Elimination of the additional gates will also provide increased speed of operation.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is claimed as desired to be secured by Letters Patent of the United States is as follows:

1. A three input Exclusive OR-NOR gate circuit comprising:
    first, second and third inverters each having an input for receiving one of three logical input signals and an output for providing an output signal which is an inverted input signal;
    a power potential terminal;
    a reference potential terminal;
    an Exclusive NOR output node for receiving a signal from one of said terminals and an Exclusive OR output node for receiving a signal from the other terminal;
    first and second PMOS transistors connected between said power potential terminal and said Exclusive NOR and Exclusive OR output nodes, and responsive to the signals on said Exclusive OR and Exclusive NOR output nodes, respectively;
    first, second and third NMOS transistors connected between said Exclusive NOR output node and said reference potential terminal;
    fourth, fifth and sixth NMOS transistors connected between said Exclusive OR output node and said reference potential terminal;
    seventh and eighth NMOS transistors connected between said Exclusive NOR output node and said third NMOS transistor; and
    ninth and tenth NMOS transistors connected between said Exclusive OR output node and said sixth NMOS transistor;
    wherein said first, second, fourth, fifth and sixth NMOS transistors are responsive to said inverted input signals, and said third, seventh, eighth, ninth and tenth NMOS transistors are responsive to said input signals.

2. The three input Exclusive OR-NOR gate circuit according to claim 1 wherein:
    each of said first and second PMOS transistors has a source, drain and gate electrode, with the gate of said first PMOS connected to said Exclusive OR output node and the gate of said second PMOS connected to said Exclusive NOR output node.

3. The three input Exclusive OR-NOR gate circuit according to claim 2 wherein:
    the source of said first PMOS transistor is connected to said power potential terminal and the drain of said first PMOS transistor is connected to said Exclusive NOR output node; and
    the source of said second PMOS transistor is connected to said power potential terminal and the drain of said second PMOS transistor is connected to said Exclusive OR output node.

4. The three input Exclusive OR-NOR gate circuit according to claim 1 wherein:
    each of said NMOS transistors has a source, drain and gate electrode with the gates of said first and fourth NMOS transistors connected to said first inverter output, the gates of said seventh and ninth NMOS transistors connected to said first inverter input, the gates of said second and fifth NMOS transistors connected to said second inverter output, the gates of said eighth and tenth NMOS transistors connected to said second inverter input, the gate of said third NMOS transistor connected to said third inverter input, and the gate of said sixth NMOS transistor connected to said third inverter output.

5. The three input Exclusive OR-NOR gate circuit according to claim 4 wherein:
    the drain of said first NMOS transistor is connected to said Exclusive NOR output node, the source of said first NMOS transistor is connected to the drain of said second NMOS transistor, the source of said second NMOS transistor is connected to the drain of said third NMOS transistor, and the source of said third NMOS transistor is connected to said reference potential terminal.

6. The three input Exclusive OR-NOR gate circuit according to claim 4 wherein:
    the drain of said fourth NMOS transistor is connected to said Exclusive OR output node, the source of said fourth NMOS transistor is connected to the drain of said fifth NMOS transistor, the source of said fifth NMOS transistor is connected to the drain of said sixth NMOS transistor, and the source of said sixth NMOS transistor is connected to said reference potential terminal.

7. The three input Exclusive OR-NOR gate circuit according to claim 4 wherein:
    the drain of said seventh NMOS transistor is connected to said Exclusive NOR output node, the source of said seventh NMOS transistor is connected to the drain of said eighth NMOS transistor, and the source of said eighth NMOS transistor is connected to the drain of said third NMOS transistor.

8. The three input Exclusive OR-NOR gate circuit according to claim 4 wherein:
    the drain of said ninth NMOS transistor is connected to said Exclusive OR output node, the source of said ninth NMOS transistor is connected to the drain of said tenth NMOS transistor, and the source of said tenth NMOS transistor is connected to the drain of said sixth NMOS transistor.

9. A three input Exclusive OR-NOR gate circuit comprising:
    inverting means for receiving three input signals and for providing three inverted input signals;
    a power potential terminal;
    a reference potential terminal;
    an Exclusive NOR output node for receiving a signal from one of said terminals and an Exclusive OR output node for receiving a signal from the other terminal;
    first switching means of a first conductivity type connected between said power potential terminal and said output nodes; and
    second switching means of a second conductivity type connected between said output nodes and said reference potential terminal;

wherein said first switching means are responsive to the signals on said output nodes for connecting said power potential terminal solely to one of said nodes and said second switching means are responsive to said input and inverted input signals for connecting said reference potential terminal solely to the other of said nodes.

10. The three input Exclusive OR-NOR gate circuit according to claim 9 wherein:
said inverting means includes first, second and third inverters each having an input for receiving one of said three input signals and an output for providing an output signal which is one of said inverted input signals.

11. The three input Exclusive OR-NOR gate circuit according to claim 9 wherein:
said switching means of a first conductivity type includes first and second PMOS transistors connected between said power potential terminal and said Exclusive NOR and Exclusive OR output nodes, and responsive to the signals on said Exclusive OR and Exclusive NOR output nodes, respectively.

12. The three input Exclusive OR-NOR gate circuit according to claim 11 wherein:
each of said first and second PMOS transistors has a source, drain and gate electrode, with the gate of said first PMOS connected to said Exclusive OR output node and the gate of said second PMOS connected to said Exclusive NOR output node;
the source and drain of said first PMOS transistor are connected between said power potential terminal and said Exclusive NOR output node; and
the source and drain of said second PMOS transistor are connected between said power potential terminal and said Exclusive OR output node.

13. The three input Exclusive OR-NOR gate circuit according to claim 9 wherein said switching means of a second conductivity type includes:
first, second and third NMOS transistors connected between said Exclusive NOR output node and said reference potential terminal;
fourth, fifth and sixth NMOS transistors connected between said Exclusive OR output node and said reference potential terminal;
seventh and eighth NMOS transistors connected between said Exclusive NOR output node and said third NMOS transistor; and
ninth and tenth NMOS transistors connected between said Exclusive OR output node and said sixth NMOS transistor;
wherein said first, second, fourth, fifth and sixth NMOS transistors are responsive to said inverted input signals, and said third, seventh, eighth, ninth and tenth NMOS transistors are responsive to said input signals.

14. The three input Exclusive OR-NOR gate circuit according to claim 13 wherein:
each of said NMOS transistors has a control electrode with the control electrodes of said first and fourth NMOS transistors receiving a first of said three input signals, the control electrodes of said seventh and ninth NMOS transistors receiving a first of said three inverted input signals, the control electrodes of said second and fifth NMOS transistors receiving a second of said three input signals, the control electrodes of said eighth and tenth NMOS transistors receiving a second of said three inverted input signals, the control electrode of said third NMOS transistor receiving a third of said three input signals, and the control electrode of said sixth NMOS transistor receiving a third of said three inverted input signals.

15. A three input Exclusive OR-NOR gate circuit comprising:
inverting means for receiving three input signals and for providing three inverted input signals;
a power potential terminal;
a reference potential terminal;
an Exclusive NOR output node for receiving a signal from one of said terminals and an Exclusive OR output node for receiving a signal from the other terminals;
switching means of a first conductivity type responsive to the signals on said output nodes for connecting said power potential terminal solely to one of said nodes; and
switching means of a second conductivity type responsive to said input and inverted input signals for connecting said reference potential terminal solely to the other of said nodes.

* * * * *